(12) United States Patent
Takeda et al.

(10) Patent No.: US 10,002,714 B2
(45) Date of Patent: Jun. 19, 2018

(54) DIELECTRIC FILM AND DIELECTRIC ELEMENT

(71) Applicant: TDK Corporation, Tokyo (JP)

(72) Inventors: Saori Takeda, Tokyo (JP); Masahito Furukawa, Tokyo (JP); Masanori Kosuda, Tokyo (JP); Shirou Ootsuki, Tokyo (JP); Yasunori Harada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 198 days.

(21) Appl. No.: 15/134,799

(22) Filed: Apr. 21, 2016

(65) Prior Publication Data

US 2016/0329152 A1   Nov. 10, 2016

(30) Foreign Application Priority Data

May 7, 2015   (JP) ................. 2015-094760

(51) Int. Cl.
| | |
|---|---|
| *H01G 4/33* | (2006.01) |
| *H01G 4/12* | (2006.01) |
| *H01G 4/08* | (2006.01) |
| *C04B 35/468* | (2006.01) |
| *C04B 35/622* | (2006.01) |
| *C04B 35/626* | (2006.01) |
| *C23C 14/08* | (2006.01) |

(52) U.S. Cl.
CPC ............ *H01G 4/33* (2013.01); *C04B 35/4682* (2013.01); *C04B 35/6261* (2013.01); *C04B 35/62218* (2013.01); *C23C 14/088* (2013.01); *H01G 4/085* (2013.01); *H01G 4/1227* (2013.01); *H01G 4/1245* (2013.01); *C04B 2235/3208* (2013.01); *C04B 2235/3217* (2013. 01); *C04B 2235/3224* (2013.01); *C04B 2235/3241* (2013.01); *C04B 2235/3244* (2013.01); *C04B 2235/3262* (2013.01); *C04B 2235/3281* (2013.01); *C04B 2235/3286* (2013.01); *C04B 2235/604* (2013.01); *C04B 2235/6567* (2013.01); *C04B 2235/787* (2013.01); *C04B 2235/788* (2013.01); *C04B 2235/79* (2013.01)

(58) Field of Classification Search
None
See application file for complete search history.

(56) References Cited

U.S. PATENT DOCUMENTS

| | | | |
|---|---|---|---|
| 6,184,044 B1 | 2/2001 | Sone et al. | |
| 9,818,548 B2 * | 11/2017 | Saita | ................. H01G 4/33 |
| 9,837,211 B2 * | 12/2017 | Saita | ................. H01G 4/1227 |

(Continued)

FOREIGN PATENT DOCUMENTS

| | | |
|---|---|---|
| JP | H10-200069 A | 7/1998 |
| JP | H11-177051 A | 7/1999 |

*Primary Examiner* — John J Figueroa
(74) *Attorney, Agent, or Firm* — Oliff PLC

(57) ABSTRACT

The present invention relates to a dielectric element such as a thin-film capacitor including a dielectric film. The dielectric film contains a main component represented by the general formula $(Ba_{1-x}Ca_x)_z(Ti_{1-y}Zr_y)O_3$ wherein $0 < x \leq 0.500$, $0 < y \leq 0.350$, and $0.900 \leq z \leq 0.995$. The dielectric film includes a layer containing columnar crystal grains and a layer containing spherical crystal grains, and contains as a sub-component at least one of divalent metal elements and trivalent metal elements.

6 Claims, 1 Drawing Sheet

(56) References Cited

U.S. PATENT DOCUMENTS

| | | | |
|---|---|---|---|
| 2012/0075768 A1* | 3/2012 | Takeda | H01G 4/1227 361/301.4 |
| 2013/0342960 A1* | 12/2013 | Saita | H01G 4/008 361/305 |
| 2016/0217931 A1* | 7/2016 | Saita | H01G 4/33 |
| 2017/0047165 A1* | 2/2017 | Saeki | H01G 4/008 |

* cited by examiner

DIELECTRIC FILM AND DIELECTRIC ELEMENT

BACKGROUND OF THE INVENTION

1. Field of the Invention

The present invention relates to a dielectric film and a dielectric element such as a thin-film capacitor which includes the dielectric film.

2. Description of the Related Art

With multi-functionalization of electronic apparatuses, various functions are desired to be added to electronic circuit boards contained in electronic apparatuses. Therefore, the number of electronic components mounted on an electronic circuit board tends to increase. Thus, there is strong demand for improving the mounting density of electronic components.

One of the proposed answers to the demand is to embed electronic components in an electric circuit board. One of the many electronic components mounted on an electronic circuit board is a usual laminated ceramic capacitor. However, when the laminated ceramic capacitor is embedded in an electric circuit board, the thickness of the laminated ceramic capacitor and brittleness due to a ceramic property cause the problem of producing, by the stress generated in an embedding process, cracks in the laminated ceramic capacitor or deformation in a portion of the electric circuit board where the laminated ceramic capacitor is embedded.

It is difficult to resolve the problem even by a usual laminated ceramic capacitor having a very small shape. Therefore, a thinner lower-profile capacitor than the laminated ceramic capacitor is required as a capacitor for embedding in an electric circuit board. A thin-film capacitor is generally known as a low-profile capacitor.

Thin-film capacitors are widely used for decoupling capacitors as small high-performance electronic components. Therefore, thin-film capacitors with high dielectric constant are required.

In the related art, Japanese Unexamined Patent Application Publication No. 10-200069 discloses a technique for a dielectric film including a layer containing columnar crystal grains and a layer containing spherical crystal grains as a dielectric film having a high dielectric constant and high resistivity. Also, for the problem of low reproducibility of Japanese Unexamined Patent Application Publication No. 10-200069, Japanese Unexamined Patent Application Publication No. 11-177051 discloses a technique that a dielectric film includes a layer containing columnar crystal grains and a layer containing spherical crystal grains, and when an oxide of the spherical crystal grains is represented by general formula $ABO_3$, an A element/B element ratio is 1.1 to 1.5. Thus, reproducibility is secured, and improvements in dielectric constant and insulation are realized. However, the dielectric constant is as low as about 450, and thus it is difficult to achieve the currently required capacitance. In addition, no consideration is given to the behaviors of the dielectric constant with direct-current voltage, and no description is made of knowledge about changes in the dielectric constant or capacitance with the structure and direct-current voltage. In general, when a desired capacitance is achieved, a measure often taken is multilayering or more thinning of a dielectric film. In many cases, multilayering cannot be performed because of thicknesses. On the other hand, when thinning of a dielectric film is performed, as an adverse effect, a high voltage is applied to the thinner dielectric film during use, and thus a higher field intensity than usual is applied to the dielectric film. This causes the problem of decreasing the dielectric constant of the dielectric film, resulting in decrease in the capacitance of a dielectric element.

SUMMARY OF THE INVENTION

Because of the changes in application described above, there is demand for a small decrease in capacitance with direct-current voltage in association with an increase in practical electric field due to thinning.

Accordingly, the present invention has been achieved in consideration of the above-described situation, and it is an object of the present invention to provide a dielectric film having a small difference in dielectric constant between with and without a DC voltage applied and having a high dielectric constant even with a DC voltage applied, and also provide a dielectric element including the dielectric film.

In order to achieve the object, a dielectric film according to the present invention contains a main component represented by the general formula $(Ba_{1-x}Ca_x)_z(Ti_{1-y}Zr_y)O_3$ (hereinafter abbreviated as "BCTZ") wherein $0<x\leq0.500$, $0<y\leq0.350$, and $0.900\leq z\leq0.995$. The dielectric film includes a layer containing columnar crystal grains and a layer containing spherical crystal grains and contains as a sub-component at least one of divalent metal elements and trivalent metal elements.

Herein, the columnar crystal grains and the layer containing the columnar crystal grains of the present invention are described. The columnar crystal grains of the present invention each represent a crystal grain having a grain boundary length in a vertical direction, which is 1.1 times or more as long as that in a horizontal direction when a section of the dielectric film in the thickness direction is observed. However, a grain boundary length need not be completely vertical or horizontal and may be inclined at about ±5° in the thickness-direction section of the dielectric film. The layer containing the columnar crystal grains is a layer composed of columnar crystal grains at an area ratio of 80% or more.

Next, the spherical crystal grains and the layer containing the spherical crystal grains of the present invention are described. The spherical crystal grains of the present invention each represent a crystal grain satisfying 1.0<aspect ratio<1.1 when a section in the thickness direction of the dielectric film is observed. The layer containing the spherical crystal grains is a layer composed of spherical crystal grains at an area ratio of 80% or more. The "main component" represents a compound contained at 50 mol % or more in the dielectric film, and the "grain boundary" represents an interface present between two or more crystals in a polycrystal.

The dielectric film of the present invention described above has a small difference in dielectric constant between with and without a direct-current voltage applied and also has a high dielectric constant even with a direct-current voltage applied. Therefore, a dielectric element including the dielectric film can cause a small decrease in dielectric constant with a direct-current voltage. The inventors consider that this effect is caused by factors described below. However, functions are not limited to the following.

First, the main component of the dielectric film is represented by the general formula $(Ba_{1-x}Ca_x)_z(Ti_{1-y}Zr_y)O_3$ wherein $0<x\leq0.500$, $0<y\leq0.350$, and $0.900\leq z\leq0.995$, and thus the grain boundary resistivity can be increased by controlling a solid-solution region of the sub-component. When $BaTiO_3$ further contains Ca and Zr within the respective ranges described above and z falls within the range described above, the function of suppressing the solid-solution of the sub-component in crystals tends to increase. Therefore, the ratio of the sub-component present at grain boundaries or near the grain boundaries rather than inside the crystal grains can be increased. For example, $BaTiO_3$ not containing Ca and Zr and $(Ba_{0.5}Sr_{0.5})TiO_3$ do not have the effect described above, and thus the effect of the present invention cannot be obtained.

Further, when at least one of divalent metal elements and trivalent metal elements is contained as the sub-component more present at the grain boundaries or near the grain boundaries, the effect of increasing the grain boundary resistivity of the crystal grains tends to be easily achieved. In the present invention, it is confirmed that the layer containing the spherical crystal grains having many grain boundaries shows higher resistivity than that of the layer containing the columnar crystal grains. It was thus found that a difference in resistivity between the layer containing the columnar crystal grains and the layer containing the spherical crystal grains can be controlled by allowing the main component to contain the sub-component of the present invention.

Next, the columnar crystal grains have the characteristic of easily growing to large crystal grains, and thus the dielectric constant of the layer containing the columnar crystal grains easily becomes higher than that of the layer containing the spherical crystal grains. However, the layer containing the columnar crystal grains which are easily oriented in a crystal plane orientation has a high dielectric constant with a very low direct-current voltage but has the property that the dielectric constant rapidly decreases with an increase in the direct-current voltage. Therefore, a dielectric element including only the layer containing the columnar crystal grains has difficulty in achieving desired capacitance because the dielectric constant is decreased when the direct-current voltage is applied. On the other hand, the spherical crystal grains are little oriented in a crystal plane orientation, and thus the layer containing the spherical crystal grains has a low dielectric constant with a very low direct-current voltage but has the property of a high dielectric constant with the direct-current voltage applied. Therefore, the layer containing the columnar crystal grains shows a high dielectric constant the low voltage applied but the dielectric constant rapidly decreases with the high voltage applied. On the other hand, the layer containing the spherical crystal grains shows a low dielectric constant but the dielectric constant little decreases even with the high voltage applied.

Therefore, in order to maximally exhibit the characteristics of the two layers, controlling can be made using a difference in resistivity between the two layers, which is the effect of the sub-component, so that the voltage applied to the layer containing the columnar crystal grains is low, and the voltage applied to the layer containing the spherical crystal grains is high. Consequently, it is possible to obtain the dielectric film having a small difference in dielectric constant between with and without the direct-current voltage applied and having a high dielectric constant even with the direct-current voltage applied.

In a preferred embodiment of the present invention, the sub-component is at least one of Mn, Cu, Cr, Al, Ga, In, and the rare-earth elements. It was confirmed that these elements tend to be easily solid-soluted near the grain boundaries. This effect causes the effect of further increasing the grain boundary resistivity, resulting in an increase in the resistivity of the layer containing the spherical crystal grains having many grain boundaries. Therefore, the difference in resistivity can be controlled to be larger so that the voltage applied to the spherical crystal grains is higher and the voltage applied to the columnar crystal grains is lower, thereby having a higher dielectric constant even with the direct-current voltage applied.

In addition, the dielectric film is preferably characterized by containing 0.01 mol to 7.00 mol of the sub-component relative to 100 mol of the main component. With the sub-component within the range, there is the function of being able to maintain the high grain boundary resistivity. This results in an increase the resistivity of the layer containing the spherical crystal grains having many crystal boundaries, and thus the difference in resistivity can be controlled to be larger, thereby making it possible to have a higher dielectric constant even with the direct-current voltage applied.

In addition, when the content of the sub-component in the layer containing the columnar crystal grains is Ac (mol %) and the content of the sub-component in the layer containing the spherical crystal grains is Ag (mol %), a relation between Ac and Ag is preferably $1.01 \leq Ag/Ac \leq 1.40$. The relation can increase the resistivity of the layer containing the spherical crystal grains. Thus, the difference in resistivity between the layer containing the spherical crystal grains and the layer containing the columnar crystal grains can be further increased. Also, when the layer containing the spherical crystal grains contains a large amount of the sub-component, the function of suppressing the growth of spherical crystal grains can be obtained, and thus many grain boundaries can be secured, thereby increasing the function of increasing the resistivity of the layer containing the spherical crystal grains. Therefore, the voltage applied to the layer containing the spherical crystal grains can be further decreased, resulting in a small difference in dielectric constant between with and without the direct-current voltage applied and a high dielectric constant even with the direct-current voltage applied.

The dielectric element including the dielectric film according to the present invention and an electrode can provide a dielectric element having a small difference in dielectric constant between with and without the direct-current voltage applied and a high dielectric constant even with the direct-current voltage applied.

The present invention can provide a dielectric film having a small difference in dielectric constant between with and without the direct-current voltage applied and a high dielectric constant even with the direct-current voltage applied, and also provide a dielectric element including the dielectric film.

DESCRIPTION OF THE PREFERRED EMBODIMENTS

Figure 1:
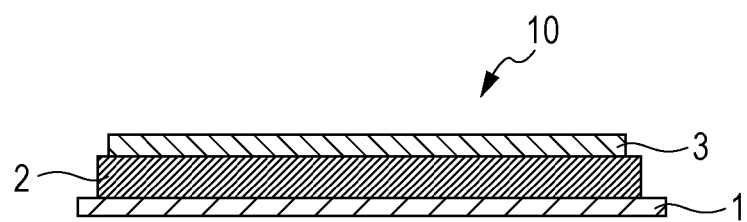
FIG. 1 is a cross-sectional view of a thin-film capacitor according to an embodiment of the present invention.

An embodiment of the present invention is described below on the basis of the drawing.

<Thin-Film Capacitor 10>

FIG. 1 is a cross-sectional view of a thin-film capacitor 10 according to a preferred embodiment as a dielectric element of the present invention. As shown in FIG. 1, the thin-film capacitor 10 according to the embodiment includes a lower electrode 1, an upper electrode structure 3 provided on the lower electrode 1, and a dielectric film 2 provided between the lower electrode 1 and the upper electrode structure 3. The shape of the thin-film capacitor 10 is not particularly limited and may be any desired size.

<Lower Electrode 1>

The lower electrode 1 may be composed of a base metal or a noble metal and is preferably composed of Cu or Ni and particularly preferably Ni. In view of lower cost of Ni than a noble metal, Ni is preferred. The purity of Ni constituting the lower electrode 1 is preferably as high as possible and preferably 99.99% by mass or more.

The thickness of the lower electrode 1 can be easily changed by polishing or the like, and thus the total thickness of the thin-film capacitor can be arbitrarily changed. A metal plate capable of achieving thinning of the thin-film capacitor is preferred, but a metal thin film formed on a substrate of Si, glass, ceramic, or the like may be used. Like in the metal plate, when a metal thin film is formed on a substrate of Si, glass, ceramic, or the like, a treatment of previously thinning the substrate before the formation of a metal thin film or thinning after the formation is required according to purpose. When the lower electrode 1 includes a metal plate, the thickness of the lower electrode 1 is preferably 5 μm to 100 μm and more preferably 20 μm to 70 μm. When the lower electrode 1 has a thickness of less than 5 μm, the lower electrode 1 tends to be difficult to handle during manufacture of the thin-film capacitor 10. When the lower electrode 1 includes a metal thin film formed on a substrate, a material used for forming the lower electrode 1 is not particularly limited as long as it has conductivity. The lower electrode 1 can be formed by using a metal such as platinum (Pt), ruthenium (Ru), rhodium (Rh), palladium (Pd), iridium (Ir), gold (Au), silver (Ag), copper (Cu), nickel (Ni), or the like. In view of cost and dielectric loss, Cu and Ni are preferred. The thickness of the metal thin film is not particularly limited as long as the metal thin film can function as one of the electrodes of the thin-film capacitor. The thickness of the metal thin film is preferably 50 nm or more, and the thickness of the substrate is preferably 5 μm to 100 μm. In order to improve adhesion between the substrate and the metal thin film, an adhesive layer may be formed on the substrate before the metal thin film is formed on the substrate. A material used for forming the adhesive layer is not particularly limited as long as it bonds the substrate, the metal thin film, and the dielectric film 2. For example, the adhesive layer can be formed by using an oxide of titanium or chromium.

<Dielectric Film 2>

Figure 2:
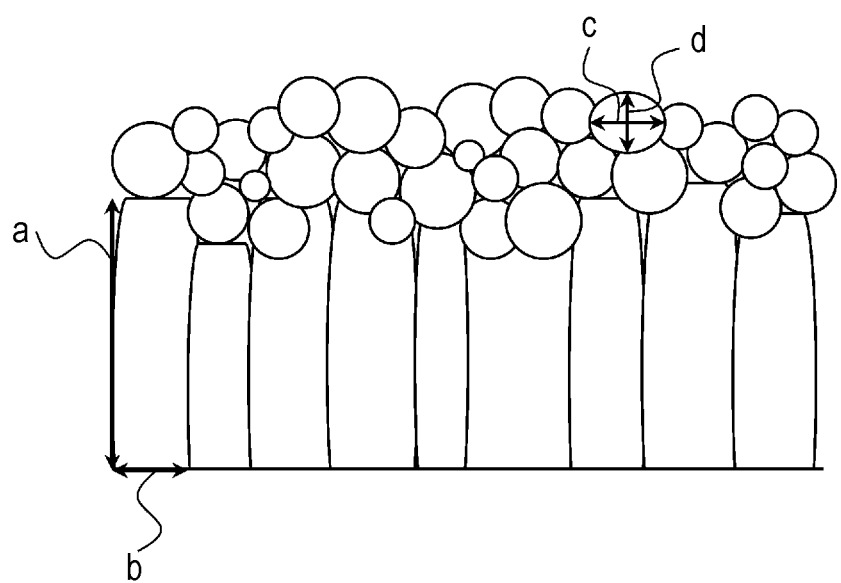
FIG. 2 is a cross-sectional view of a dielectric film according to an embodiment of the present invention.

FIG. 2 is a drawing showing a cross-section of the dielectric film 2 according to the embodiment of the present invention observed with a transmission electron microscope. The dielectric film of the present invention contains a main component represented by the general formula $(Ba_{1-x}Ca_x)_z(Ti_{1-y}Zr_y)O_3$ wherein $0<x\leq0.500$, $0<y\leq0.350$, and $0.900\leq z\leq0.995$. The dielectric film includes a layer containing columnar crystal grains and a layer containing spherical crystal grains and contains as a sub-component at least one of divalent metal elements and trivalent metal elements.

The "main component" represents a compound contained at 50 mol % or more in the dielectric film. Other compounds contained at 50 mol % or less include a sub-component and impurities.

The columnar crystal grains of the present invention each represent a crystal grain having a relation of $a/b\geq1.1$ wherein when a section in the thickness direction of the dielectric film is observed, a is the grain boundary length of the columnar crystal grain in a vertical direction in the thickness-direction section of the dielectric film shown in FIG. 2, and b is the grain boundary length of the columnar crystal grain in a horizontal direction in the thickness-direction section of the dielectric film. In addition, the spherical crystal grains of the present invention each represent a crystal grain having a relation of $1.0<c/d<1.1$, wherein when a section of the dielectric film in the thickness direction is observed, c is the maximum diameter of the spherical crystal grain and d is the diameter perpendicular to the maximum diameter of the spherical crystal grain. The value of the grain boundary length a in the vertical direction of the columnar crystal grain shown in FIG. 2 is preferably 40 nm to 1500 nm. In addition, the values of the maximum diameter c of the spherical crystal grain and the diameter d perpendicular to the maximum diameter of the spherical crystal grain shown in FIG. 2 are preferably 5 nm to 800 nm. The layer containing the columnar crystal grains is a layer composed of the columnar crystal grains at an area ratio of 80% or more, and the layer containing the spherical crystal grains is a layer composed of spherical crystal grains at an area ratio of 80% or more.

In the dielectric film within the composition range described above, a decrease in capacitance with the direct-current voltage can be decreased. It is considered that this can be realized by the effect of the sub-component staid near the grain boundaries because the main component contains Ca or Zr and $0.900\leq z\leq0.995$. When Ca or Zr in the composition is out of the range described above, the sub-component is not solid-soluted in a BCTZ crystal or is uniformly solid-soluted in the crystal. Therefore, it is difficult to obtain the effect of achieving a small difference in dielectric constant between with and without the direct-current voltage applied and a high dielectric constant even with the direct-current voltage applied.

Further, when the main component contains a divalent metal element and a trivalent metal element as the sub-component, there is the effect of increasing the grain boundary resistivity of the crystal grains, resulting in an increase in resistivity of the layer containing the spherical crystal grains having many grain boundaries. Therefore, the difference in resistivity between the layer containing the columnar crystal grains and the layer containing the spherical crystal grains can be controlled. When the sub-component is not contained, the difference in resistivity between the layer containing the columnar crystal grains and the layer containing the spherical crystal grains is decreased, and thus a change in capacitance with the direct-current voltage is increased. In addition, when the divalent metal element and the trivalent metal element are contained as the sub-component, the elements function as an acceptor and thus cause the effect of further increasing the grain boundary resistivity.

The divalent metal element and the trivalent metal element contained as the sub-component may be any elements which can have a divalent or trivalent positive charge. Also, divalent metal elements, trivalent metal elements, and rare-earth elements can be used in combination of a plurality of types.

The dielectric film having the structure described above can comply with a decrease in capacitance with an increase in the electric field intensity applied to the dielectric film in association with thinning.

The sub-component is preferably present near the crystal grain boundaries at a higher ratio than the ratio in the crystal grains. With this structure, the grain boundary resistivity is further increased, and a high dielectric constant is exhibited even with the direct-current voltage applied. In order to further increase the grain boundary resistivity, at least one of Mn, Cu, Cr, Al Ga, In, and the rare-earth elements is preferably added, and the elements of Mn, Cu, Cr, and Y are more preferred. These elements tend to be solid-soluted near the grain boundaries and thus have the effect of further increasing the grain boundary resistivity.

In addition, the dielectric film is preferably characterized by containing 0.01 mol to 7.00 mol of the sub-component relative to 100 mol of the main component. The sub-component within the range described above causes the function that a high grain boundary resistivity can be maintained. However, the sub-component out of the range causes the small effect of increasing the resistivity.

The dielectric film more preferably has the relation of $1.01 \leq Ag/Ac \leq 1.40$ between Ac and Ag wherein Ac (mol %) is the content of the sub-component in the layer containing the columnar crystal grains and Ag (mol %) is the content of the sub-component in the layer containing the spherical crystal grains. This structure can be confirmed by, for example, a scanning transmission electron microscope (STEM) with an attached elemental analysis apparatus (EDS: energy dispersive X-ray spectroscopy). A sample obtained is cut along a plane perpendicular to a substrate. Any 20 columnar crystal grains are selected in a section, and a straight line in any direction is drawn to pass through a center of a circumscribed circle of each of the grains. Then, point analysis is performed at intervals of 10 nm along the straight line in each of the grains to determine contents of the sub-component. An average of the contents is calculated and regarded as the content Ac (mol %) of the sub-component in the layer containing the columnar crystal grains. Similarly, analysis is performed for each of any 20 spherical crystal grains. An average of the contents is calculated and regarded as the content Ag (mol %) of the sub-component in the layer containing the spherical crystal grains. A value of Ag/Ac is calculated from these values. Also, a content distribution of the sub-component from a grain boundary to the center of each of the crystal grains can be confirmed by the method described above, and thus the content of the sub-component near the grain boundary of each grains can be confirmed. In order to produce many grain boundaries having high insulation, the layer containing the spherical crystal grains preferably contains the sub-component at a higher ratio than that in the layer containing the columnar crystal grains. The crystal grains containing a large amount of the sub-component soluted at Ti sites easily become spherical crystal grains because the grain growth is suppressed. Within this range, insulation can be more securely secured by the layer containing the spherical crystal grains, and the voltage applied to the layer containing the columnar crystal grains is decreased. This further increases the effect of achieving a small difference in dielectric constant between with and without the direct-current voltage applied and a high dielectric constant even with the direct-current voltage applied.

The dielectric film according to the embodiment may further contain another component, for example, a transition metal element or the like, according to desired characteristics.

The thickness of the dielectric film 2 may be properly determined according to application and is, for example, about 45 nm to 2000 nm. When the thickness of the dielectric film 2 is 2000 nm or more, brittleness of ceramics becomes remarkable, and thus cracks may occur in the dielectric film during production of the dielectric film or in an embedding process. Further, in order to achieve a high capacitance as a capacitor per mounting area and a high dielectric constant even with the direct-current voltage applied, the thickness of the dielectric film 2 is more preferably 50 nm to 1500 nm.

The shape of the dielectric film according to the embodiment is not particularly limited. For example, the shape may be a square shape of 10 mm in length and 10 mm width or 1000 mm in length and 1000 mm in width.

<Upper Electrode Structure 3>

In the embodiment, the thin-film capacitor 10 includes the upper electrode structure 3 disposed on the surface of the dielectric film 2 and functioning as the other electrode of the thin-film capacitor 10. A material used for forming the upper electrode structure 3 is not particularly limited as long as it has conductivity, and the upper electrode structure 3 can be formed by using the same material as the lower electrode 1. Further, an electrode thin film serving as the upper electrode structure 3 can be formed at room temperature, and thus the thin film of the upper electrode structure 3 can also be formed by using a base metal, such as iron (Fe), nickel (Ni), copper (Cu), or the like, or an alloy such as tungsten silicide ($WSi_2$), molybdenum silicide ($MoSi_2$), or the like. The thickness of the upper electrode structure 3 is not particularly limited as long as it functions as the other electrode of the thin-film capacitor and can be determined to, for example, 10 nm to 10,000 nm.

Next, a method for manufacturing the thin-film capacitor 10 according to the embodiment is described.

First, a Ni plate is prepared as the lower electrode 1.

Next, a precursor of the dielectric film 2 is formed on the lower electrode 1. The precursor of the dielectric film 2 can be formed by a thin film forming method such as a vacuum vapor deposition method, a sputtering method, a pulsed laser deposition method (PLD method), a metal-organic chemical vapor deposition method (MOCVD method), a metal organic decomposition method (MOD method), a chemical solution deposition method such as a sol-gel method, or the like.

In the sputtering method, the precursor of the dielectric film 2 is formed on the lower electrode 1 by using a target having a desired composition. Preferred conditions include an atmosphere argon (Ar)/oxygen ($O_2$) ratio of 5/1 to 2/1, a pressure of 0.01 Pa to 10 Pa, and a high-frequency power of 100 W to 350 W.

Preferred deposition conditions for forming a columnar-grain portion in the dielectric film include a pressure of 1 Pa to 10 Pa and a frequency power of 100 W to 200 W. Columnar crystals are easily grown by decreasing a deposition rate. Preferred deposition conditions for forming a spherical-grain portion in the dielectric film include a pressure of 0.1 Pa to 1 Pa and a frequency power of 200 W to 350 W.

The resultant precursor of the dielectric film 2 is annealed. Annealing is preferably performed at a heating rate of 50° C./hour to 8000° C./hour and more preferably 200° C./hour to 8000° C./hour. A retention temperature for annealing is preferably 1000° C. or less and more preferably 800° C. to 950° C. A retention time for annealing is preferably 0.05 hours to 2.0 hours, more preferably 0.1 hours to 2.0 hours, and particularly preferably 0.5 hours to 2.0 hours. With the retention temperature and the retention time within these respective ranges, the dielectric film having a small change in capacitance with the direct-current voltage while having high dielectric constant can be obtained. In addition, the occurrence of cracks and peeling in the dielectric film can be prevented.

In order to solid-solute the sub-component near the grain boundaries, the annealing atmosphere preferably includes a strongly reducing atmosphere (oxygen partial pressure of $10^{-14}$ MPa to $10^{-10}$ MPa) and a subsequent weakly reducing atmosphere (oxygen partial pressure of $10^{-10}$ MPa to $10^{-6}$ MPa). In the strongly reducing atmosphere, oxygen elements are removed from BCTZ, thereby creating an atmosphere in which the sub-component easily diffuses in BCTZ. Next annealing in the weakly reducing atmosphere has the effect of compensating for oxygen in BCTZ and pushing the sub-component to the grain boundaries. The phrase "near the grain boundaries" represents a region of 20 nm or less from a grain boundary to the center of a crystal grain.

Next, for example, a Pt thin film is formed as the upper electrode structure 3 on the resultant dielectric film 2 by, for example, a sputtering method, thereby producing the thin-film capacitor 10.

Although, in the embodiment described above, the thin-film capacitor is described as an example of a dielectric element according to the present invention, a dielectric element according to the present invention is not limited to the thin-film capacitor and may be any dielectric element including the dielectric film.

Although the embodiment of the present invention is described above, the present invention is not limited to the embodiment described above, and various modifications can be made without deviating from the gist of the present invention.

EXAMPLES

The present invention is described in further detail below based on examples, but the present invention is not limited to these examples.

Example 1, Examples 3 to 31, and Comparative Examples 3 to 13

A Ni plate having a thickness of 50 μm was prepared as a lower electrode. The Ni plate had dimensions of 10 mm in length and 10 mm in width.

A target for sputtering was produced by a solid phase method. The mixing ratios of raw material powders of BaO, CaO, SrO, $TiO_2$, and $ZrO_2$ in the target and a sub-component were adjusted so as to obtain each of the dielectric film compositions shown in Table 1 to Table 4.

Next, the raw material powders were wet-mixed in a ball mill for 20 hours using water as a solvent, and the resultant mixed powder was dried at 100° C.

The mixed powder was pressed to form a molded body. The molding conditions included a pressure of 100 Pa, a temperature of 25° C., and a pressing time of 3 minutes.

Then, the molded body was sintered at a retention temperature of 1300° C. for a temperature keeping time of 10 hours in an air atmosphere.

Then, the resultant sintered body was processed into a diameter of 200 mm and a thickness of 6 mm by using a surface grinder and a cylindrical grinding machine to produce the target for sputtering required for forming the dielectric film.

In order to form the dielectric film on the lower electrode, a sputtering method was used under conditions described below.

In order to form a columnar-grain portion including a layer containing columnar crystal grains in the dielectric film, a film was deposited to 350 nm by using the target at a substrate temperature of 400° C., an atmosphere argon (Ar)/oxygen ($O_2$) ratio of 3/1, a pressure of 1 Pa, a high-frequency power of 200 W, and a deposition rate of 70 nm/hour.

Next, in order to form a spherical-grain portion including a layer containing spherical crystal grains in the dielectric film, a film was deposited to 50 nm at a substrate temperature of 400° C., an atmosphere argon (Ar)/oxygen ($O_2$) ratio of 3/1, a pressure of 0.1 Pa, a high-frequency power of 100 W, and a deposition rate of 150 nm/hour. Then, the resultant film was annealed under conditions described below to produce the dielectric film. The total thickness of the dielectric film was 400 nm.

Annealing was performed under annealing conditions including a (wet $N_2+H_2$) mixed gas atmosphere (oxygen partial pressure of $3\times10^{-11}$ MPa), a heating rate of 600° C./hour, a retention temperature of 850° C. to 950° C., a retention time of 1.0 hour. Then, annealing was performed under annealing conditions including a (wet $N_2+H_2$) mixed gas atmosphere (oxygen partial pressure of $1\times10^{-9}$ MPa), a heating rate of 600° C./hour, a retention temperature of 500° C., a retention time of 1.0 hour.

Next, a Pt thin film was formed as the upper electrode structure on the resultant dielectric film by a sputtering method using a mask so that the diameter was 5 mm and the thickness was 50 nm, thereby producing a sample of each of Example 1, Examples 3 to 31, and Comparative Examples 3 to 13 shown in Table 1 to Table 4.

Each of the resultant thin-film capacitor samples was measured with respect to dielectric constant, a change in capacitance with a direct-current voltage, resistance, and composition ratio by methods described below.

<Dielectric Constant>

The dielectric constant (no unit) was calculated from capacitance measured for each of the thin-film capacitor samples at a reference temperature of 25° C. by using a digital LCR meter (4274A manufactured by YHP Company) under the conditions including a frequency of 1 kHz, an input signal level (measurement voltage) of 400 mVrms. The dielectric constant is preferably as high as possible, and in the examples, a dielectric constant of 1000 or more was evaluated as "good".

<Change in Capacitance with Direct-Current Voltage>

The dielectric constant was calculated from capacitance measured for each of the thin-film capacitor samples with a direct-current voltage of 400 mV applied at a reference temperature of 25° C. by using a digital LCR meter (4274A manufactured by YHP Company) under the conditions including a frequency of 1 kHz, an input signal level (measurement voltage) of 400 mVrms. The dielectric constant of 700 or more was evaluated as "good" and the dielectric constant of 800 or more was evaluated as "very good".

<Resistance>

The resistance of the thin-film capacitor sample was measured with a direct-current voltage of 400 mV applied for 30 seconds. In the examples, the measurement was performed for 10 samples, and a sample having an average value of resistance of 10 MΩ or more was determined as "good".

<Composition Ratio of Dielectric Film>

The composition of the produced dielectric film was measured for all samples by X-ray fluorescence analysis (XRF). As a result, the compositions shown in Table 1 to Table 5 were confirmed.

<Confirmation of Crystal Grain Shape of Dielectric Film>

The columnar crystal grains and spherical crystal grains were confirmed by observing a section of the thin film with a transmission electron microscope.

<Confirmation of Sub-Component Content in Layer Containing Columnar Crystal Grains and Layer Containing Spherical Crystal Grains>

The resultant sample was cut along a plane perpendicular to the substrate. Any 20 columnar crystal grains were selected in the section, and a straight line in any direction was drawn to pass through a center of a circumscribed circle of each of the grains by a scanning transmission electron microscope (STEM) with an attached elemental analysis apparatus (EDS: energy dispersive X-ray spectroscopy). Then, point analysis was performed at intervals of 10 nm along the straight line in each of the grains to determine contents of the sub-component. An average of the contents was regarded as Ac (mol %). The same analysis was performed for each of any 20 spherical crystal grains. An average of the contents was regarded as Ag (mol %). A value of Ag/Ac was calculated from these values.

The measurement results are shown in Table 1 to Table 4.

In Table 1 to Table 5, "−" represents an adding amount of 0. In the column of "Determination" in Table 1 to Table 5, "○" represents satisfying the dielectric constant of 1000 or more, the dielectric constant of 700 or more with the direct-current voltage applied, and the resistance of 10 MΩ or more, "⊙" represents satisfying the dielectric constant of 1000 or more, the dielectric constant of 800 or more with the direct-current voltage applied, and the resistance of 10 MΩ or more, and "x" represents that these values are not satisfied.

TABLE 1

| Example/ Comparative Example | Film composition $(Ba_{1-x}Ca_x)_z(Ti_{1-y}Zr_y)O_3$ | | | Sub-component | Relative to 100 mol main component (mol) | Production method | Film structure | |
|---|---|---|---|---|---|---|---|---|
| | x | y | z | | | | Columnar | Spherical |
| Example 1 | 0.200 | 0.200 | 0.995 | MnO | 0.200 | Sputtering method | ○ | ○ |
| Comparative Example 1 | 0.200 | 0.200 | 0.995 | MnO | 0.200 | Sputtering method | ○ | X |
| Comparative Example 2 | 0.200 | 0.200 | 0.995 | MnO | 0.200 | Sputtering method | X | ○ |
| Comparative Example 3 | — | 0.200 | 0.995 | MnO | 0.200 | Sputtering method | ○ | ○ |
| Comparative Example 4 | 0.200 | — | 0.995 | MnO | 0.200 | Sputtering method | ○ | ○ |

| Example/ Comparative Example | Ag/Ac | Dielectric constant (—) | Dielectric constant with DC voltage applied (—) | Resistance (MΩ) | Determination |
|---|---|---|---|---|---|
| Example 1 | 1.31 | 1288 | 1095 | 830.0 | ⊙ |
| Comparative Example 1 | 1.27 | 1167 | 584 | 0.6 | X |
| Comparative Example 2 | 1.21 | 890 | 783 | 1209.0 | X |
| Comparative Example 3 | 1.87 | 970 | 776 | 524.0 | X |
| Comparative Example 4 | 0.70 | 771 | 694 | 310.0 | X |

TABLE 2

| Example/ Comparative Example | Film composition | Sub-component | Relative to 100 mol main component (mol) | Production method | Film structure | | Ag/Ac | Dielectric constant (—) | Dielectric constant with DC voltage applied (—) | Resistance (MΩ) | Determination |
|---|---|---|---|---|---|---|---|---|---|---|---|
| | | | | | Columnar | Spherical | | | | | |
| Comparative Example 5 | $(Ba_{0.5}Sr_{0.5})TiO3$ | MnO | 0.200 | Sputtering method | ○ | ○ | 1.3 | 470 | 188 | 5700 | X |

TABLE 3

| Example/ Comparative Example | Film composition $(Ba_{1-x}Ca_x)_z(Ti_{1-y}Zr_y)O_3$ | | | Sub-component | Relative to 100 mol main component (mol) | Production method | Film structure | |
|---|---|---|---|---|---|---|---|---|
| | x | y | z | | | | Columnar | Spherical |
| Comparative Example 6 | 0.200 | 0.200 | 0.995 | — | — | Sputtering method | ○ | ○ |
| Comparative Example 7 | 0.200 | 0.200 | 0.895 | MnO | 0.200 | Sputtering method | ○ | ○ |
| Comparative Example 8 | 0.200 | 0.200 | 1.000 | MnO | 0.200 | Sputtering method | ○ | ○ |
| Example 2 | 0.200 | 0.200 | 0.995 | MnO | 0.200 | PLD method | ○ | ○ |
| Comparative Example 9 | 0.550 | 0.200 | 0.995 | MnO | 0.200 | Sputtering method | ○ | ○ |
| Example 3 | 0.500 | 0.200 | 0.995 | MnO | 0.200 | Sputtering method | ○ | ○ |
| Example 4 | 0.350 | 0.200 | 0.995 | MnO | 0.200 | Sputtering method | ○ | ○ |
| Example 5 | 0.100 | 0.200 | 0.995 | MnO | 0.200 | Sputtering method | ○ | ○ |

TABLE 3-continued

| | | | | | | | | |
|---|---|---|---|---|---|---|---|---|
| Example 6 | 0.010 | 0.200 | 0.995 | MnO | 0.200 | Sputtering method | ○ | ○ |
| Comparative Example 10 | 0.200 | 0.400 | 0.995 | MnO | 0.200 | Sputtering method | ○ | ○ |
| Example 7 | 0.200 | 0.350 | 0.995 | MnO | 0.200 | Sputtering method | ○ | ○ |
| Example 8 | 0.200 | 0.150 | 0.995 | MnO | 0.200 | Sputtering method | ○ | ○ |
| Example 9 | 0.200 | 0.010 | 0.995 | MnO | 0.200 | Sputtering method | ○ | ○ |
| Comparative Example 11 | 0.200 | 0.200 | 0.995 | Li2O | 0.200 | Sputtering method | ○ | ○ |
| Example 10 | 0.200 | 0.200 | 0.995 | CuO | 0.200 | Sputtering method | ○ | ○ |
| Example 11 | 0.200 | 0.200 | 0.995 | ZnO | 0.200 | Sputtering method | ○ | ○ |
| Example 12 | 0.200 | 0.200 | 0.995 | $Cr_2O_3$ | 0.200 | Sputtering method | ○ | ○ |
| Example 13 | 0.200 | 0.200 | 0.995 | $Al_2O_3$ | 0.200 | Sputtering method | ○ | ○ |
| Example 14 | 0.200 | 0.200 | 0.995 | $Ga_2O_3$ | 0.200 | Sputtering method | ○ | ○ |
| Example 15 | 0.200 | 0.200 | 0.995 | $In_2O_3$ | 0.200 | Sputtering method | ○ | ○ |
| Example 16 | 0.200 | 0.200 | 0.995 | $Bi_2O_3$ | 0.200 | Sputtering method | ○ | ○ |
| Example 17 | 0.200 | 0.200 | 0.995 | $Y_2O_3$ | 0.200 | Sputtering method | ○ | ○ |
| Example 18 | 0.200 | 0.200 | 0.995 | $Gd_2O_3$ | 0.200 | Sputtering method | ○ | ○ |
| Example 19 | 0.200 | 0.200 | 0.995 | $Tb_2O_3$ | 0.200 | Sputtering method | ○ | ○ |
| Example 20 | 0.200 | 0.200 | 0.995 | $Dy_2O_3$ | 0.200 | Sputtering method | ○ | ○ |
| Example 21 | 0.200 | 0.200 | 0.995 | $Ho_2O_3$ | 0.200 | Sputtering method | ○ | ○ |
| Example 22 | 0.200 | 0.200 | 0.995 | $Sm_2O_3$ | 0.200 | Sputtering method | ○ | ○ |
| Example 23 | 0.200 | 0.200 | 0.995 | $Yb_2O_3$ | 0.200 | Sputtering method | ○ | ○ |
| Comparative Example 12 | 0.200 | 0.200 | 0.995 | $SiO_2$ | 0.200 | Sputtering method | ○ | ○ |
| Comparative Example 13 | 0.200 | 0.200 | 0.995 | $WO_3$ | 0.200 | Sputtering method | ○ | ○ |

| Example/Comparative Example | Ag/Ac | Dielectric constant (—) | Dielectric constant with DC voltage applied (—) | Resistance (MΩ) | Determination |
|---|---|---|---|---|---|
| Comparative Example 6 | — | 1500 | Unmeasurable | Unmeasurable | X |
| Comparative Example 7 | 1.11 | 894 | 554 | 89.0 | X |
| Comparative Example 8 | 1.13 | 749 | 727 | 120.0 | X |
| Example 2 | 1.19 | 1043 | 918 | 566.0 | ⊙ |
| Comparative Example 9 | 1.37 | 962 | 847 | 900.0 | X |
| Example 3 | 1.36 | 1161 | 1022 | 912.0 | ⊙ |
| Example 4 | 1.20 | 1220 | 1074 | 689.0 | ⊙ |
| Example 5 | 1.20 | 1279 | 1126 | 561.0 | ⊙ |
| Example 6 | 1.24 | 1338 | 1177 | 523.0 | ⊙ |
| Comparative Example 10 | 1.40 | 978 | 861 | 20.0 | X |
| Example 7 | 1.38 | 1002 | 882 | 661.0 | ⊙ |
| Example 8 | 1.24 | 1042 | 813 | 213.0 | ⊙ |
| Example 9 | 1.26 | 1162 | 837 | 81.0 | ⊙ |
| Comparative Example 11 | 1.39 | 1099 | Unmeasurable | Unmeasurable | X |
| Example 10 | 1.37 | 1222 | 953 | 779.0 | ⊙ |
| Example 11 | 1.12 | 1002 | 701 | 31.0 | ○ |
| Example 12 | 1.37 | 1160 | 905 | 67.1 | ⊙ |
| Example 13 | 1.28 | 1099 | 901 | 96.2 | ⊙ |
| Example 14 | 1.35 | 1138 | 899 | 44.0 | ⊙ |
| Example 15 | 1.36 | 1000 | 800 | 74.9 | ⊙ |
| Example 16 | 1.19 | 1204 | 722 | 21.8 | ○ |
| Example 17 | 1.37 | 1062 | 903 | 32.8 | ⊙ |
| Example 18 | 1.29 | 1139 | 866 | 55.9 | ⊙ |
| Example 19 | 1.32 | 1114 | 847 | 75.7 | ⊙ |
| Example 20 | 1.30 | 1157 | 879 | 62.0 | ⊙ |
| Example 21 | 1.34 | 1096 | 833 | 59.5 | ⊙ |
| Example 22 | 1.17 | 1039 | 800 | 129.0 | ⊙ |
| Example 23 | 1.30 | 1031 | 804 | 18.9 | ⊙ |
| Comparative Example 12 | 1.40 | 866 | 606 | 123.0 | X |
| Comparative Example 13 | 1.40 | 566 | 498 | 0.1 | X |

TABLE 4

| Example/Comparative Example | Film composition $(Ba_{1-x}Ca_x)_z(Ti_{1-y}Zr_y)O_3$ | | | Relative to 100 mol main component (mol) | | Production method | Film structure | |
|---|---|---|---|---|---|---|---|---|
| | x | y | z | MnO | CuO | | Columnar | Spherical |
| Example 24 | 0.200 | 0.200 | 0.995 | 0.010 | — | Sputtering method | ○ | ○ |
| Example 25 | 0.200 | 0.200 | 0.995 | 1.500 | — | Sputtering method | ○ | ○ |
| Example 26 | 0.200 | 0.200 | 0.995 | 5.500 | — | Sputtering method | ○ | ○ |
| Example 27 | 0.200 | 0.200 | 0.995 | 7.000 | — | Sputtering method | ○ | ○ |

TABLE 4-continued

| Example 28 | 0.200 | 0.200 | 0.995 | 8.500 | — | Sputtering method | ○ | ○ |
| Example 29 | 0.200 | 0.200 | 0.995 | — | 0.200 | Sputtering method | ○ | ○ |
| Example 30 | 0.200 | 0.200 | 0.995 | 0.100 | 0.100 | Sputtering method | ○ | ○ |
| Example 31 | 0.200 | 0.200 | 0.995 | — | 0.200 | Sputtering method | ○ | ○ |

| Example/ Comparative Example | Ag/Ac | Dielectric constant (—) | Dielectric constant with DC voltage applied (—) | Resistance (MΩ) | Determination |
|---|---|---|---|---|---|
| Example 24 | 1.01 | 1332 | 1066 | 232.0 | ⊙ |
| Example 25 | 1.26 | 1187 | 831 | 56.3 | ⊙ |
| Example 26 | 1.38 | 1102 | 804 | 26.2 | ⊙ |
| Example 27 | 1.40 | 1044 | 814 | 23.3 | ⊙ |
| Example 28 | 1.40 | 1012 | 789 | 20.5 | ○ |
| Example 29 | 1.36 | 1198 | 958 | 559.0 | ⊙ |
| Example 30 | 1.21 | 1132 | 906 | 359.0 | ⊙ |
| Example 31 | 1.30 | 1283 | 962 | 672.0 | ⊙ |

In the column of "Film structure" in Tables 1 to 5, the dielectric film having the layer containing the columnar crystal grains and the layer containing the spherical crystal grains is expressed as "○", and the dielectric film having neither the layer containing the columnar crystal grains nor the layer containing the spherical crystal grains is expressed as "x".

Comparative Example 1

A dielectric film sample of Comparative Example 1 was formed at a substrate temperature of 400° C., an atmosphere argon (Ar)/oxygen ($O_2$) ratio of 3/1, a pressure of 1 Pa, a high-frequency power of 200 W, and a deposition rate of 70 nm/hour so that the total thickness of the dielectric film was 400 nm.

The sample of Comparative Example 1 was formed by the same method as in Example 1 except that a film was formed only under conditions including a pressure of 1 Pa, a high-frequency power of 200 W, and a deposition rate of 70 nm/hour.

The resultant sample of Comparative Example 1 was evaluated by the same method as in Example 1. The results are shown in Table 1.

Comparative Example 2

A dielectric film sample of Comparative Example 2 was formed at a substrate temperature of 400° C., an atmosphere argon (Ar)/oxygen ($O_2$) ratio of 3/1, a pressure of 0.1 Pa, a high-frequency power of 100 W, and a deposition rate of 150 nm/hour so that the total thickness of the dielectric film was 400 nm.

The sample of Comparative Example 2 was formed by the same method as in Example 1 except that a film was formed only under conditions including a pressure of 0.1 Pa, a high-frequency power of 100 W, and a deposition rate of 150 nm/hour.

The resultant sample of Comparative Example 2 was evaluated by the same method as in Example 1. The results are shown in Table 1.

Example 2

A target for PLD was produced by the same target forming method as in Example 1. The mixing ratios of raw material powders of BaO, CaO, $TiO_2$, and $ZrO_2$ in the target and a sub-component were adjusted so as to obtain the dielectric film composition shown in Table 3.

In order to form the dielectric film on a lower electrode, a PLD method was used using the target for PLD under conditions described below.

In order to form a columnar-grain portion including a layer containing columnar crystal grains in the dielectric film, a film was deposited to 350 nm at a substrate temperature of 400° C., an atmosphere $Ar/O_2$ ratio of 5/1, a pressure of 0.1 Pa, a laser power of 25 mJ/cm², and a deposition rate of 50 nm/hour. Then, in order to form a spherical-grain portion including a layer containing spherical crystal grains in the dielectric film, a film was deposited to 50 nm at a substrate temperature of 400° C., an atmosphere $Ar/O_2$ ratio of 5/1, a pressure of 0.01 Pa, a laser power of 50 mJ/cm², and a deposition rate of 110 nm/hour, thereby producing the dielectric film. The total thickness of the dielectric film was 400 nm.

A sample of Example 2 was formed by the same method as in Example 1 except that a dielectric film was formed by the PLD method.

The resultant sample of Example 2 was evaluated by the same method as in Example 1. The results are show in Table 3.

Example 32

A target for sputtering was produced by the same solid-phase method as in Example 1. The mixing ratios of raw material powders of BaO, CaO, $TiO_2$, and $ZrO_2$ in the target and a sub-component were adjusted so as to obtain the dielectric film composition shown in Table 5.

A dielectric film was formed under the same conditions as in Example 1.

Annealing was performed under annealing conditions including a (wet $N_2+H_2$) mixed gas atmosphere (oxygen partial pressure of $3\times10^{-11}$ MPa), a heating rate of 600° C./hour, a retention temperature of 950° C., a retention time of 1.0 hour.

Then, a sample of Example 32 was formed by the same method as in Example 1 except that the annealing conditions were as described above.

The resultant sample of Example 32 was evaluated by the same method as in Example 1. The results are shown in Table 5.

Example 33

A target for sputtering was produced by the same solid-phase method as in Example 1. The mixing ratios of raw material powders of BaO, CaO, TiO$_2$, and ZrO$_2$ in the target and a sub-component were adjusted so as to obtain the dielectric film composition shown in Table 5.

A dielectric film was formed under the same conditions as in Example 1.

Annealing was performed under annealing conditions including a (wet N$_2$+H$_2$) mixed gas atmosphere (oxygen partial pressure of $3\times10^{-11}$ MPa), a heating rate of 600° C./hour, a retention temperature of 950° C., a retention time of 1.0 hour. Then, annealing was performed under annealing conditions including a (wet N$_2$+H$_2$) mixed gas atmosphere (oxygen partial pressure of $1\times10^{-6}$ MPa), a heating rate of 600° C./hour, a retention temperature of 500° C., a retention time of 1.0 hour.

A sample of Example 33 was formed by the same method as in Example 1 except that the annealing conditions were as described above.

The resultant sample of Example 33 was evaluated by the same method as in Example 1. The results are shown in Table 5.

grains and the layer containing the spherical crystal grains. In this case, the dielectric film has a small difference in dielectric constant between with and without the direct-current voltage applied but fails to have a high dielectric constant with the direct-current voltage applied.

Example 2

Table 3 indicates that in Example 2, the dielectric film contains the main component represented by the general formula $(Ba_{1-x}Ca_x)_z(Ti_{1-y}Zr_y)O_3$ wherein $0<x\le0.500$, $0<y\le0.350$, and $0.900\le z\le0.995$, and the dielectric film includes the layer containing the columnar crystal grains and the layer containing the spherical crystal grains and contains as the sub-component at least one of divalent metal elements and trivalent metal elements. Also, it can be confirmed from Table 3 that regardless of the film forming method, the dielectric film has a small difference in dielectric constant between with and without the direct-current voltage applied and has a high dielectric constant even with the direct-current voltage applied.

Example 1 and Example 10 to Example 23

Table 1 and Table 3 indicate that in Example 1 and Examples 10 to 23, the dielectric film contains the main

TABLE 5

| Example/Comparative Example | Film composition $(Ba_{1-x}Ca_x)_z(Ti_{1-y}Zr_y)O_3$ | | | Sub-component | Relative to 100 mol main component (mol) | Production method | Film structure | |
|---|---|---|---|---|---|---|---|---|
| | x | y | z | | | | Columnar | Spherical |
| Example 32 | 0.200 | 0.200 | 0.995 | MnO | 0.200 | Sputtering method | ○ | ○ |
| Example 33 | 0.200 | 0.200 | 0.995 | MnO | 0.200 | Sputtering method | ○ | ○ |

| Example/Comparative Example | Ag/Ac | Dielectric constant (—) | Dielectric constant with DC voltage applied (—) | Resistance (MΩ) | Determination |
|---|---|---|---|---|---|
| Example 32 | 1.00 | 1412 | 788 | 22.0 | ○ |
| Example 33 | 1.50 | 1006 | 797 | 1033.0 | ○ |

Example 1 and Example 3 to Example 23

Table 1 to Table 3 indicate that in Example 1 and Examples 3 to 23, the dielectric film contains the main component represented by the general formula $(Ba_{1-x}Ca_x)_z(Ti_{1-y}Zr_y)O_3$ wherein $0<x\le0.500$, $0<y\le0.350$, and $0.900\le z\le0.995$, and the dielectric film includes the layer containing the columnar crystal grains and the layer containing the spherical crystal grains and contains as the sub-component at least one of divalent metal elements and trivalent metal elements. Also, it can be confirmed from Tables 1 to 3 that the dielectric film has a dielectric constant of 1000 or more and a high dielectric constant of 700 or more even with the direct-current voltage applied.

Comparative Example 1 and Comparative Example 2

Table 1 indicates that in Comparative Examples 1 and 2, the dielectric film contains the main component represented by the general formula $(Ba_{1-x}Ca_x)_z(Ti_{1-y}Zr_y)O_3$ wherein $0<x\le0.500$, $0<y\le0.350$, and $0.900\le z\le0.995$, and the dielectric film contains as the sub-component at least one of divalent metal elements and trivalent metal elements but does not have the layer containing the columnar crystal component represented by the general formula $(Ba_{1-x}Ca_x)_z(Ti_{1-y}Zr_y)O_3$ wherein $0<x\le0.500$, $0<y\le0.350$, and $0.900\le z\le0.995$, the dielectric film includes the layer containing the columnar crystal grains and the layer containing the spherical crystal grains and contains as the sub-component at least one of divalent metal elements and trivalent metal elements, and the sub-component is at least one of Mn, Cu, Cr, Al, Ga, In, and the rare-earth elements. Also, it can be confirmed from Table 1 and Table 3 that the dielectric film has a small difference in dielectric constant between with and without the direct-current voltage applied and has a high dielectric constant even with the direct-current voltage applied.

Example 1 and Example 24 to Example 31

Table 1 and Table 4 indicate that in Example 1 and Examples 24 to 31, the dielectric film contains a main component represented by the general formula $(Ba_{1-x}Ca_x)_z(Ti_{1-y}Zr_y)O_3$ wherein $0<x\le0.500$, $0<y\le0.350$, and $0.900\le z\le0.995$, the dielectric film includes the layer containing the columnar crystal grains and the layer containing the spherical crystal grains and contains as the sub-component at least one of divalent metal elements and trivalent metal elements, the sub-component is at least one of Mn, Cu, Cr, Al, Ga, In, and the rare-earth elements, and the sub-component is contained at 0.01 mol to 7.00 mol relative to 100 mol of the main component. Also, it can be confirmed from Table 1 and Table 4 that the dielectric film has a smaller difference in dielectric constant between with and without the direct-current voltage applied and has a high dielectric constant even with the direct-current voltage applied.

Example 1 to Example 3, Example 24, Example 32, and Example 33

Table 1, Table 3, and Table 5 indicate that in Examples 1 to 3, 24, 32, and 33, the dielectric film contains a main component represented by the general formula $(Ba_{1-x}Ca_x)_z(Ti_{1-y}Zr_y)O_3$ wherein $0<x\leq0.500$, $0<y\leq0.350$, and $0.900\leq z\leq0.995$, the dielectric film includes the layer containing the columnar crystal grains and the layer containing the spherical crystal grains and contains as the sub-component at least one of divalent metal elements and trivalent metal elements, the sub-component is at least one of Mn, Cu, Cr, Al, Ga, In, and the rare-earth elements, the sub-component is contained at 0.01 mol to 7.00 mol relative to 100 mol of the main component, and a relation between Ac and Ag is $1.01\leq Ag/Ac\leq1.40$ wherein Ac (mol %) is the content of the sub-component in the layer containing the columnar crystal grains and Ag (mol %) is the content of the sub-component in the layer containing the spherical crystal grains. Also, it can be confirmed from Table 1, Table 3, and Table 5 that the dielectric film has a smaller difference in dielectric constant between with and without the direct-current voltage applied and has a higher dielectric constant even with the direct-current voltage applied.

Comparative Example 3 to Comparative Example 5 and Comparative Example 7 to Comparative Example 10

Table 1 to Table 3 indicate that in Comparative Examples 3 to 5 and Comparative Examples 7 to 10, the dielectric film includes the layer containing the columnar crystal grains and the layer containing the spherical crystal grains and contains as the sub-component at least one of divalent metal elements and trivalent metal elements, but the main component of the dielectric film is not represented by the general formula $(Ba_{1-x}Ca_x)_z(Ti_{1-y}Zr_y)O_3$ wherein $0<x\leq0.500$, $0<y\leq0.350$, and $0.900\leq z\leq0.995$. In this case, the dielectric film has a small difference in dielectric constant between with and without the direct-current voltage applied but fails to have a high dielectric constant with the direct-current voltage applied.

Comparative Example 6 and Comparative Example 11 to Comparative Example 13

Table 3 indicates that in Comparative Examples 6 and 11 to 13, the dielectric film contains the main component represented by the general formula $(Ba_{1-x}Ca_x)_z(Ti_{1-y}Zr_y)O_3$ wherein $0<x\leq0.500$, $0<y\leq0.350$, and $0.900\leq z\leq0.995$ and includes the layer containing the columnar crystal grains and the layer containing the spherical crystal grains, but the dielectric film does not contain as the sub-component at least one of divalent metal elements and trivalent metal elements. In this case, the dielectric film has a small difference in dielectric constant between with and without the direct-current voltage applied, but fails to have a high dielectric constant with the direct-current voltage applied.

As described above, the present invention relates to a dielectric element such as a thin-film capacitor including a dielectric film. The present invention can provide a dielectric film having a small difference in dielectric constant between with and without a direct-current voltage applied and having a high dielectric constant even with a DC voltage applied. Therefore, miniaturization and higher function are realized in a dielectric element such as a thin-film capacitor including a dielectric film.

What is claimed is:
1. A dielectric film comprising:
  a layer containing columnar crystal grains; and
  a layer containing spherical crystal grains, wherein the dielectric film contains a main component represented by the general formula $(Ba_{1-x}Ca_x)_z(Ti_{1-y}Zr_y)O_3$ wherein $0<x\leq0.500$, $0<y\leq0.350$, and $0.900\leq z\leq0.995$, and at least one of divalent metal elements and trivalent metal elements as a sub-component.
2. The dielectric film according to claim 1, wherein the sub-component is at least one of Mn, Cu, Cr, Al, Ga, In, and the rare-earth elements.
3. The dielectric film according to claim 1, wherein the sub-component is contained at 0.01 mol to 7.00 mol relative to 100 mol of the main component.
4. The dielectric film according to claim 1, wherein a relation between Ac and Ag is $1.01\leq Ag/Ac\leq1.40$ wherein Ac (mol %) is the content of the sub-component in the layer containing the columnar crystal grains and Ag (mol %) is the content of the sub-component in the layer containing the spherical crystal grains.
5. A dielectric element comprising the dielectric film according to claim 1 and an electrode.
6. The dielectric film according to claim 2, wherein the sub-component is contained at 0.01 mol to 7.00 mol relative to 100 mol of the main component.

* * * * *